United States Patent
Gossner

(10) Patent No.: US 7,729,094 B2
(45) Date of Patent: Jun. 1, 2010

(54) ESD PROTECTION CIRCUIT AND METHOD

(75) Inventor: Harald Gossner, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 11/811,404

(22) Filed: Jun. 8, 2007

(65) Prior Publication Data

US 2008/0002320 A1    Jan. 3, 2008

(30) Foreign Application Priority Data

Jun. 8, 2006   (DE) .................... 10 2006 026 691

(51) Int. Cl.
   *H02H 9/00*   (2006.01)
(52) U.S. Cl. ........................................ 361/56
(58) Field of Classification Search ............ 361/56, 361/111, 118; 257/355, 356
   See application file for complete search history.

(56) References Cited

U.S. PATENT DOCUMENTS

| | | | | |
|---|---|---|---|---|
| 4,630,162 | A * | 12/1986 | Bell et al. ................... | 361/56 |
| 5,157,573 | A * | 10/1992 | Lee et al. ................... | 361/56 |
| 5,946,177 | A | 8/1999 | Miller et al. | |
| 6,249,410 | B1 * | 6/2001 | Ker et al. .................. | 361/56 |
| 6,646,840 | B1 * | 11/2003 | Sugerman et al. ......... | 361/56 |
| 6,657,836 | B2 * | 12/2003 | He et al. .................. | 361/56 |
| 6,927,957 | B1 * | 8/2005 | Bakulin et al. ............ | 361/56 |
| 7,098,510 | B2 * | 8/2006 | Kodama et al. .......... | 257/355 |
| 2006/0250734 | A1 * | 11/2006 | Kato ....................... | 361/56 |
| 2008/0259511 | A1 * | 10/2008 | Worley .................... | 361/56 |

FOREIGN PATENT DOCUMENTS

WO    WO 02/37566 A2    5/2002

OTHER PUBLICATIONS

S. M. Sze, "Multiplication and Oxide Charging," Chpt 8.4.4. *Physics of Semiconductor Devices*, John Wiley and Sons, New York: 1981. pp. 480-486.

* cited by examiner

*Primary Examiner*—Stephen W Jackson
*Assistant Examiner*—Angela Brooks
(74) *Attorney, Agent, or Firm*—Maginot, Moore & Beck

(57) ABSTRACT

A method and a device are disclosed herein for protecting a circuit including a first terminal and a second terminal from electrostatic discharges. The device comprises at least one current path, wherein each current path of the at least one current path includes a transistor and a first circuit element. A first load terminal of the transistor is coupled to the first terminal of the circuit. A second load terminal of the transistor is coupled to a control terminal of the transistor and to a first terminal of the first circuit element. A second terminal of the first circuit element is coupled to the second terminal of the circuit. A well terminal of the transistor is coupled to the second terminal of the circuit via a second circuit element.

21 Claims, 6 Drawing Sheets

US 7,729,094 B2

ESD PROTECTION CIRCUIT AND METHOD

CROSS-REFERENCE TO RELATED APPLICATIONS

This application claims priority from German patent application no. DE 10 2006 026 691.9, filed Jun. 8, 2006, the contents of which are incorporated herein by reference in their entirety.

BACKGROUND

The present invention relates to a device for protecting a circuit from electrostatic discharges (ESD, electrostatic discharge) and a corresponding method.

SUMMARY

A device is disclosed herein for protecting a circuit including a first terminal and a second terminal from electrostatic discharges. The device comprises at least one current path, wherein each current path of the at least one current path includes a transistor and a first circuit element. A first load terminal of the transistor is coupled to the first terminal of the circuit. A second load terminal of the transistor is coupled to a control terminal of the transistor and to a first terminal of the first circuit element. A second terminal of the first circuit element is coupled to the second terminal of the circuit. A well terminal of the transistor is coupled to the second terminal of the circuit via a second circuit element.

BRIEF DESCRIPTION OF THE SEVERAL VIEWS OF THE DRAWINGS

Embodiments of the invention are explained in greater detail below with reference to the attached drawings which are to be taken as examples only and not to be construed as limiting the scope of this invention.

DETAILED DESCRIPTION

In the following exemplary embodiments of the present invention will be described in detail. It is to be understood that the following description is given only for the purpose of illustrating the principle of the invention and is not to be taken in a limiting sense. The scope of the invention is defined only by the appended claims and is not intended to be limited by the exemplary embodiments described hereinafter.

It is also to be understood that the features of the various exemplary embodiments described herein may be combined with each other unless specifically noted otherwise.

Figure 1:
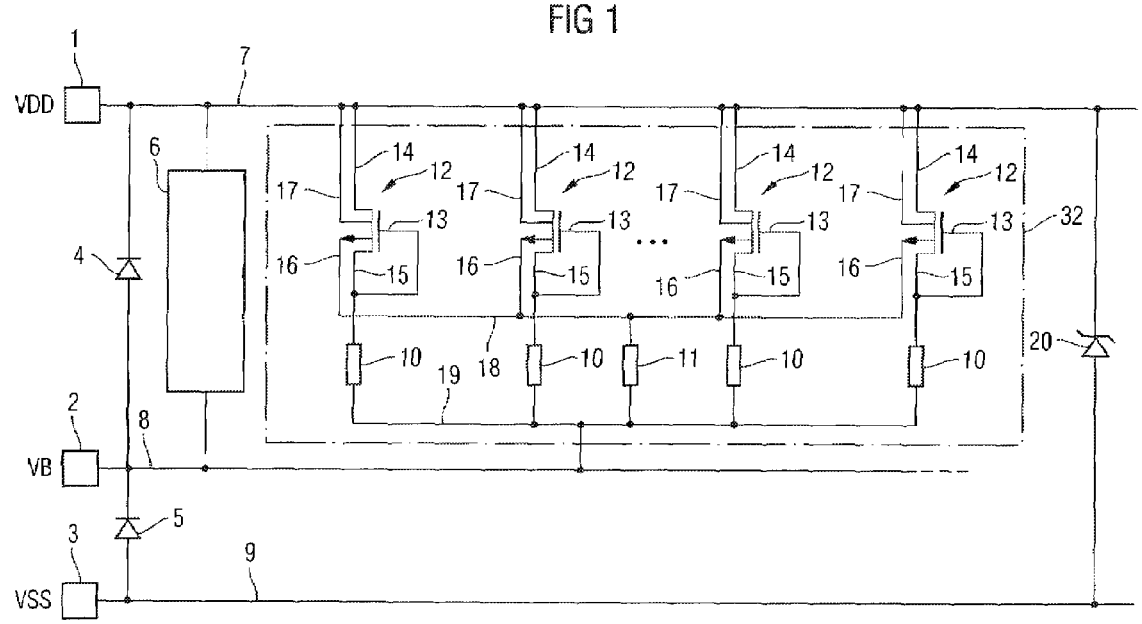
FIG. 1 shows a first embodiment of the present invention.

FIG. 1 illustrates a circuit diagram of a first embodiment of the present invention and its use in a circuit.

The circuit illustrated in FIG. 1 has a terminal 1 for a positive supply voltage VDD, which is connected to a positive supply voltage line 7, and a terminal 3 for a supply voltage VSS, for example ground, which is connected to a ground line 9. In the embodiment illustrated the positive supply voltage VDD is a voltage which is higher than the voltage for which the circuit elements of the circuit are configured. For example, the supply voltage VDD may be a 10V supply voltage, while the circuit elements of the circuit, for example transistors, are designed for an applied voltage for 1.5V. These values are to be understood only as an example, however, and other voltages may be used in other embodiments.

In circuits of this kind virtual supply voltage lines are conventionally provided, which are kept at appropriate voltages or potentials, in order to avoid damage to the circuit elements of the circuit in normal operation. Such virtual supply voltage lines generally are coupled to the circuit elements of a respective integrated circuit and kept at a potential which ensures that the circuit elements are not subjected to an excessively high voltage. In the case of circuit elements configured for a voltage of 1.5V and an input voltage of 10V applied to the integrated circuit, a virtual supply voltage of this kind could be kept at a potential or a voltage of 8.5V for example. In this case the circuit elements are coupled between the 10V input and the virtual supply voltage line, such that no greater drop in voltage than 1.5V is possible. In the same way circuit elements can be coupled between two such virtual supply voltage lines.

Virtual supply voltages of this kind in embodiments are connected to external pins of the integrated circuit, for example to connect the virtual supply voltage lines to a large external capacity, in order to buffer the virtual supply voltage line and to reduce switching noise. In the embodiment illustrated a virtual supply voltage line of this kind is designated by reference numeral 8 and connected to a terminal or pin 2. Applied to this virtual supply voltage line is a voltage VB, which differs from the positive supply voltage VDD by the allowed drop in voltage on the circuit elements. In the above numeric example in FIG. 1 VB=10V−1.5V=8.5V would apply.

A positive supply voltage which is higher than the voltage for which the circuit elements of the circuit are configured is also designated as "VDDHV" (for high voltage). A circuit section coupled to a supply voltage of this kind, in particular a logic circuit, is also designated as a "high side logic".

Circuit section 6 in FIG. 1 is a circuit section of this kind. Circuit section 6 comprises in particular transistors and further circuit elements for carrying out desired functions of the circuit. The exact construction of circuit section 6, which represents a "high side logic", as explained above, is not of significance for the understanding of the present embodiment. To understand the present embodiment it is sufficient that circuit section 6 comprises circuit elements which may be damaged if an excessively high voltage is applied, i.e., for example, >1.5V in the above numeric example.

In the embodiment shown the virtual supply voltage line 8 is connected to an external terminal, and it is protected from electrostatic discharges. Such electrostatic discharges may be produced e.g. by a person touching the terminal. Protective elements conventionally used for this purpose are not conductive in normal operation of the circuit, in other words in the above numeric example they would be allowed to become conductive only at voltages of over 10V. At such voltages the circuit elements in the integrated circuit may already be damaged.

In this respect, in the circuit of FIG. 1 ESD protective diodes 4 and 5 and also a protective element 20, which may be configured as a Schottky diode, for example, are provided and, as shown in FIG. 1, coupled to the positive supply voltage line 7, the virtual supply voltage line 8 and the ground line 9. The protective elements 4, 5 and 20 correspond to conventional ESD protective elements and do not therefore need to be explained in greater detail. Such conventional protective elements are dimensioned in such a way that in the case of voltages applied in normal operation of the circuit they are not conductive, so as not to disturb the normal operation of the circuit. If an electrostatic discharge occurs, which may generate voltages of several 1000V, these protective elements become conductive on the other hand and can shut the discharge to ground line 9 or positive supply voltage line 7, for example.

In the circuit illustrated in FIG. 1 additionally a protection arrangement 32 which represents a first embodiment of the present invention is provided.

The protection circuit 32 comprises a plurality of parallel current paths, each of which comprises a transistor 12 and a resistor 10. The transistors 12 are configured in the present embodiment as N-field-effect transistors (NFET).

A first load terminal 14 of each transistor 12 is connected to the positive supply voltage line 7, while a second load terminal 15 is connected to a control terminal 13, i.e. a gate terminal, and to a first terminal of the respective resistor 10. A second terminal of the respective resistor 10 is connected to the virtual supply voltage line 8 via a line 19.

The first load terminal 14 and the second load terminal 15 of the transistors 12 are the source and drain terminals, wherein the transistors 12 may be constructed symmetrically, so that the first load terminal 14 and the second load terminal 15 can operate both as source and as drain terminal depending on the polarity.

Furthermore, a well terminal 16 of each transistor 12 is connected to a line 18, line 18 being connected to line 19 via a resistor 11. A well terminal is here in the case of the NFET transistors to be understood as a terminal to a p-doped well, in which the n-doped load terminals are embedded and on which the gate lies. This is explained later in greater detail using FIG. 2.

A well terminal generally is to be understood as a terminal connected to a doped semiconductor material within a well or an area on which the transistor is formed.

Finally, a terminal 17 of each transistor 12 is connected to the positive supply voltage line 7. Via terminal 17 an insulating layer, for example an n-doped layer and n-doped wells arranged round the above-mentioned p-doped well, are biased in order to insulate the p-doped well from the substrate of the transistor.

The number of current paths formed in parallel is not limited to four, as indicated by three dots in FIG. 1, but it is also possible for more current paths to be provided in embodiments. On the other hand parallel connection of only two current paths or even only one single current path is also possible in other embodiments. More parallel current paths lead to greater robustness of the protection circuit 32, but on the other hand also to a greater space requirement, so that the number of parallel current paths according to an embodiment is chosen depending on the available area and the robustness required.

Figure 2:
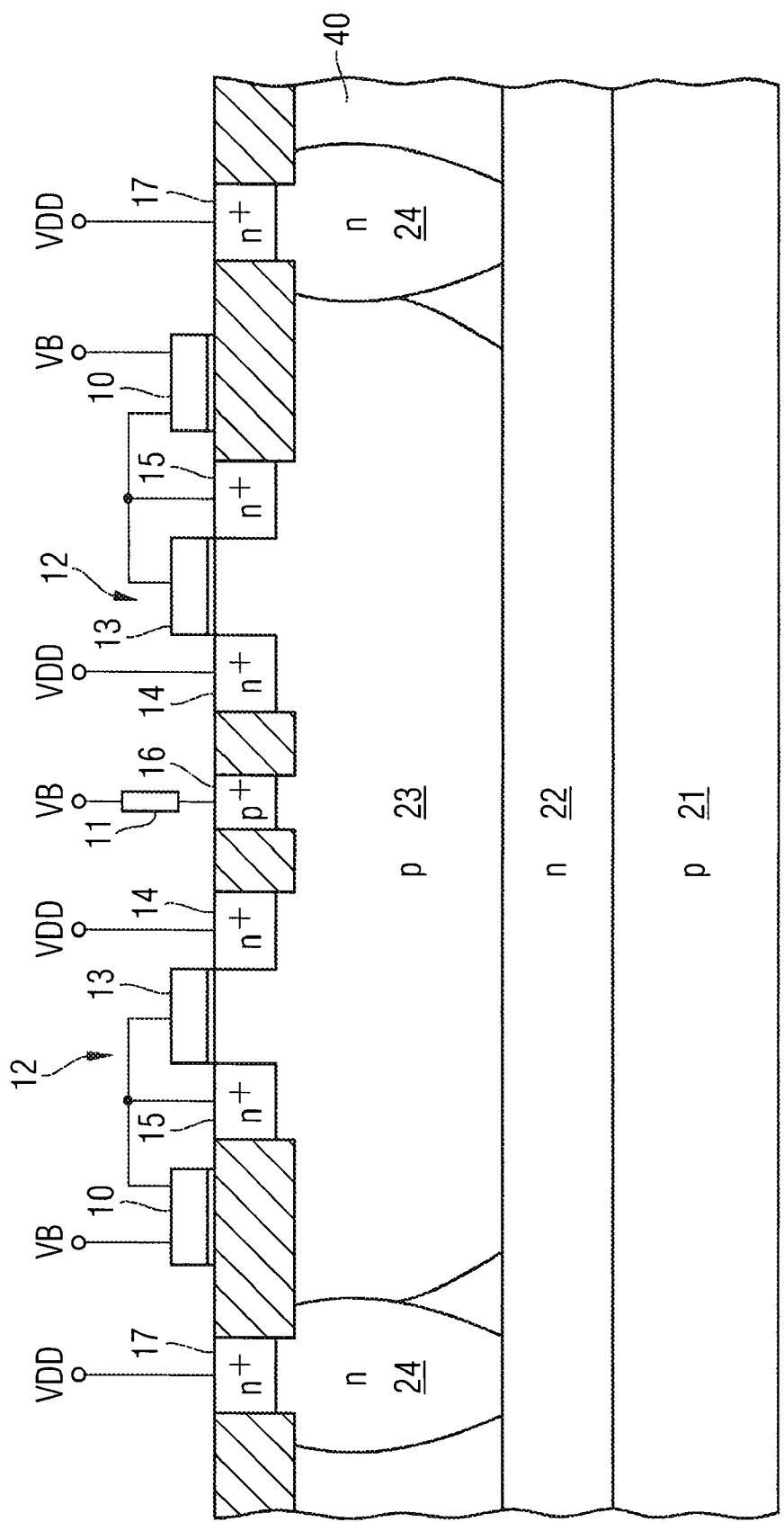
FIG. 2 shows an embodiment of a semiconductor structure for implementing the embodiment of FIG. 1.

Before the mode of functioning of the protection circuit 32 is explained in greater detail, a possible implementation of the protection circuit 32 in terms of layout technology according to an embodiment will be discussed below with reference to FIG. 2. FIG. 2 shows a cross-sectional view through a corresponding semiconductor structure, two transistors 12 being illustrated in FIG. 2.

The semiconductor structure illustrated in FIG. 2 is formed on a p-doped substrate 21. The thickness of the substrate 21 and the rest of the elements are not illustrated to scale in FIG. 2; in general the substrate 21 will be considerably thicker than the layers lying on top of it.

An n-doped layer 22 is first arranged on the substrate 21. A layer of this kind may be produced, for example, by an epitaxial method or by means of ion implantation at high implantation energies.

Located on the n-doped layer 22 is a further layer 40, which, apart from wells 23 and 24 described below, for example, may be nominally undoped. There are doped areas in the form of wells 23 and 24 present in layer 40. Doped areas of this kind can be produced by ion implantation, for example. In FIG. 2 a p-doped well 23 is surrounded by 2 n-doped wells 24. The n-doped wells 24 insulate the p-doped well 23 together with the n-doped layer 22 from the environment, in particular from substrate 21. A construction like that illustrated in FIG. 2 with the n- and p-doped wells 23 and 24 and the n-doped layer 22 is also designated as a "triple well" construction.

The p-doped well 23 serves as a well for several, in the case of FIG. 2 two, transistors 12.

A joint well terminal 16 of the transistors 12 is formed by a highly p-doped layer (p$^+$), which is connected to the virtual supply voltage line 8 or the voltage VB via resistor 11. In a similar way the terminals 17 of the transistors 12 are formed by highly n-doped (n$^+$) layers, which are connected to the positive supply voltage line 7 from FIG. 1 or to the positive supply voltage VDD. Highly p-doped or highly n-doped layers as illustrated in FIG. 2 can likewise be formed by ion implantation.

The first and second load terminals 14 and 15 of the transistors 12 are constructed as highly n-doped layers in the p-doped well 23, the distance between a first load terminal and a second load terminal 15 being bridged in each case by a gate 13, which may consist, for example, of polysilicon applied to an oxide layer (not illustrated). Resistors 10 are constructed in the semiconductor structure illustrated in FIG. 2 as polysilicon resistors and, as illustrated, coupled to the gates 13, the second load terminal 15 and the virtual supply voltage line 8 or the voltage VB. The semiconductor structure illustrated enables an implementation of the protection circuit 32 from FIG. 1 according to an embodiment. However, in other embodiments other implementations may be used.

The mode of functioning of the protection circuit 32 according to this embodiment will now be explained below. For this purpose it should first be noted that in an NFET structure as illustrated in FIG. 2, as well as the field-effect transistors 12, there are always also parasitic bipolar transistors, in which appropriate voltages may lead to a breakdown, in particular an avalanche breakdown. For example, in FIG. 2 wells 23 and 24 form an npn bipolar transistor, as do load terminals 14 and 15 together with well 23 or load terminal 15 with well 23 and the n-doped layer 22. Substrate 21, n-doped layer 22 and p-well 23 can also be regarded as a bipolar structure. These bipolar transistors play a part in the breakdown of field-effect transistors at high voltage. The therewith associated effects are known and do not therefore need to be explained in greater detail.

If a negative electrostatic discharge now occurs at terminal 2 in FIG. 1, it can be shunted via the parallel current paths to VDD, in other words to the positive supply voltage line 7. Resistors 10 of the current paths here represent a series resistance both for the lateral breakdown of the second load terminal 15 (in this case source) to the first load terminal 14 (in this case drain) and for a vertical breakdown to the n-doped layer 22. This ensures homogenisation of the flowing current over all the parallel current paths. Resistors 10 in an embodiment have a value in the range of 100-300 Ohms. In other embodiments, other values are possible.

By connecting well 23 to the virtual supply voltage line 8 via resistor 11, which in an embodiment has a resistance value of at least 100 Ohms, for example several 100 Ohms, the p-well 23, which acts as the base of the parasitic bipolar transistors alluded to, is biased. In particular the emitter-base connection (corresponding to the source-well connection) is biased if charge carriers are generated by avalanche breakdown on the drain-well connection, i.e. the emitter of the parasitic bipolar transistor is negatively biased in respect of the base or well 23. The current produced by the avalanche breakdown generates a drop in voltage via resistor 11, leading to quick connection of the parasitic bipolar transistors and thus of the parallel current paths, so that the electrostatic discharge can be efficiently shunted to VDD.

In this respect it should be noted that in the case of positive electrostatic discharges at terminal 2 from FIG. 1 the parasitic well-drain diode of transistors 12 provides a high ohmic resistance. However, by means of the protective element 4 discharges of this kind can be safely shunted. In another embodiment, an additional protective element, such as an additional diode, for example, may be provided. It should furthermore be noted that the circuit is protected from a breakdown of transistors 12 towards the substrate 21 by protective element 5 from FIG. 1.

Therefore protection of circuit section 6 of FIG. 1 from electrostatic discharges is provided by the first embodiment of the invention and a quick response of the protective arrangement is guaranteed, in particular by resistor 11, which connects the virtual supply voltage line 8 to the p-well 23.

Further embodiments of the present invention are described below with reference to FIGS. 3-8. Elements which remain the same as in the embodiment of FIGS. 1 and 2, bear the same reference numerals and are not explained again in detail.

Figure 3:
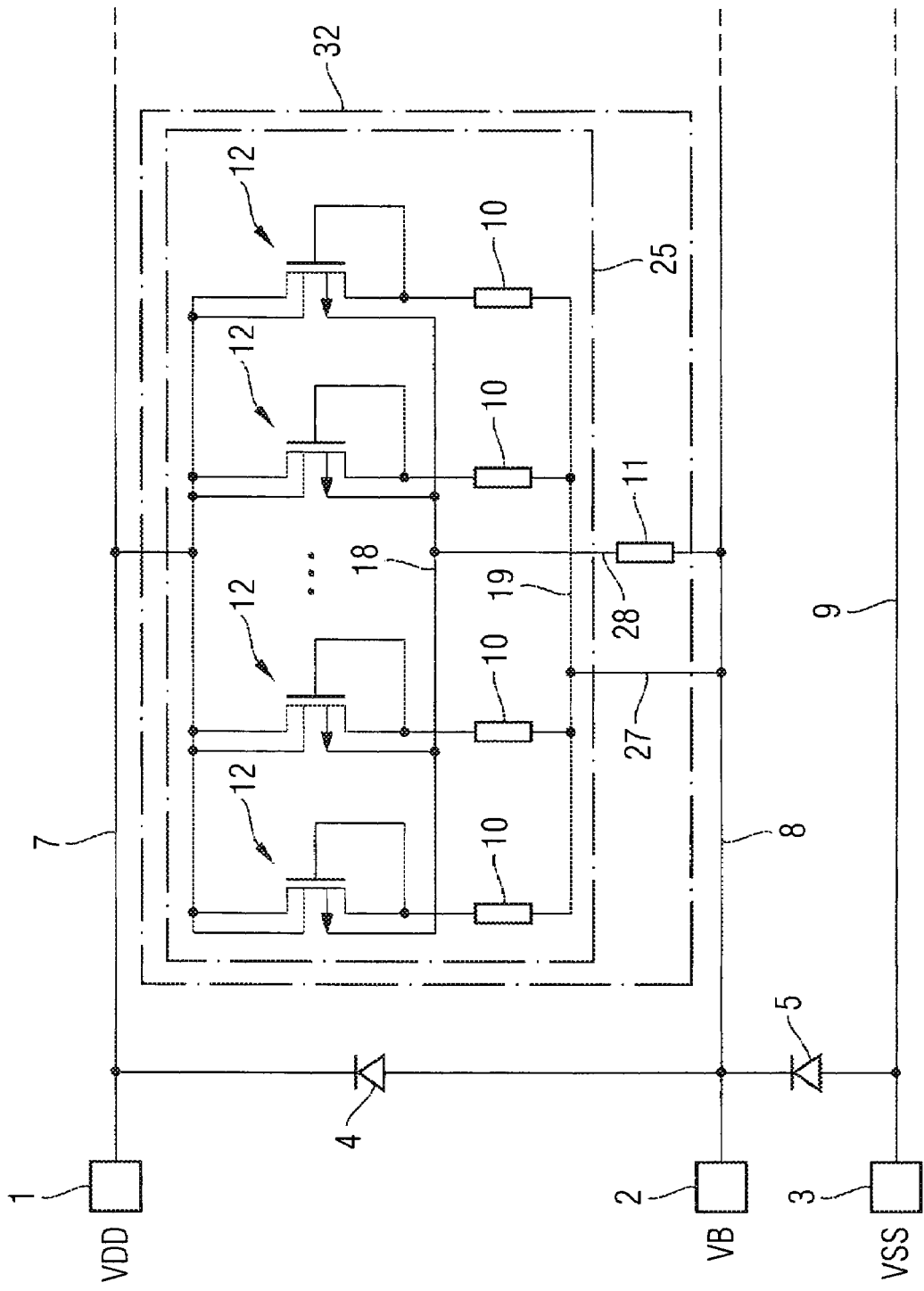
FIG. 3 shows a second embodiment of the present invention.

FIG. 3 illustrates a second embodiment of the present invention. In this embodiment line 18 is connected to the virtual supply voltage line 8 directly via resistor 11 and not via line 19 as in the embodiment of FIG. 1. Additionally, in FIG. 3 the first load terminals 4 and terminals 17 of transistors 12 are firstly connected to one another and then to the positive supply voltage line 7 via a joint terminal. This embodiment shows that the coupling of the circuit elements can take place in different ways in different embodiments, without influencing the mode of functioning of protection circuit 32.

To simplify illustration of the following embodiments, the arrangement of the parallel current paths is generally designated as 25, the terminal leading from resistors 10 to the virtual supply voltage line 8 as 27 and the terminal leading to resistor 11 as 28.

In the following embodiments the arrangement of parallel current paths is therefore generally illustrated as a black box with the reference numeral 25 and terminals 27 and 28.

Figure 4:
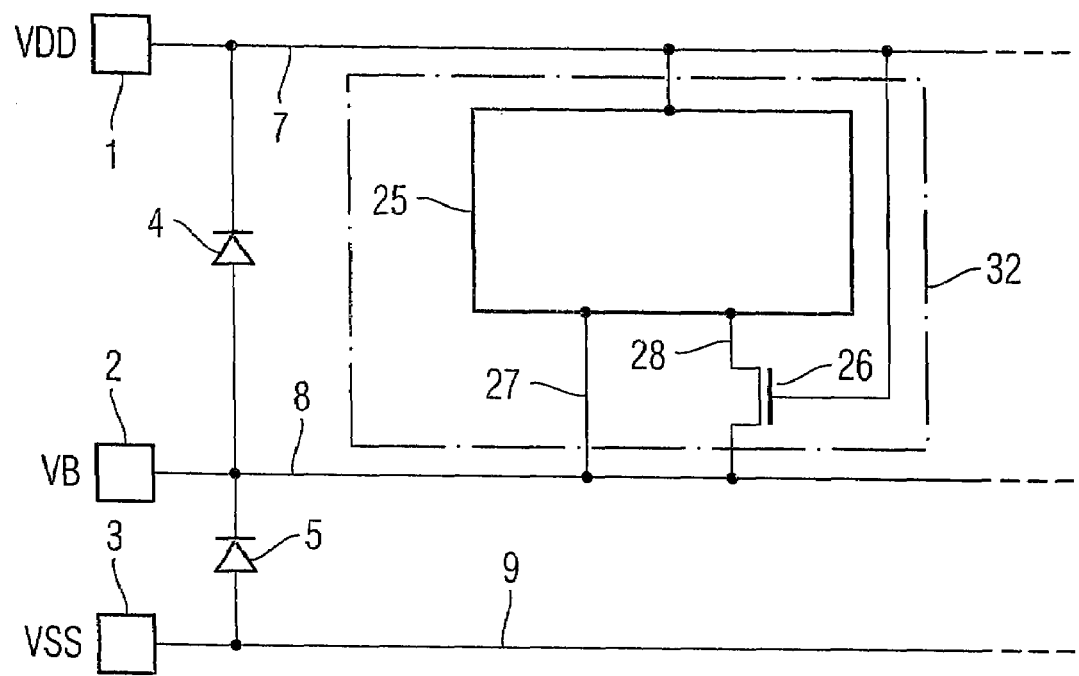
FIG. 4 shows a third embodiment of the present invention.

FIG. 4 illustrates a third embodiment of the present invention. Compared with the second embodiment of FIG. 3, resistor 11 which, like resistors 10 of FIG. 2, may be made of polysilicon, for example, has been replaced by an MOS transistor connected as a resistor, the gate of which is connected to a fixed potential, in the case of FIG. 4 to the positive supply voltage line 7, in order in this way to have a fixed resistance.

Figure 5:
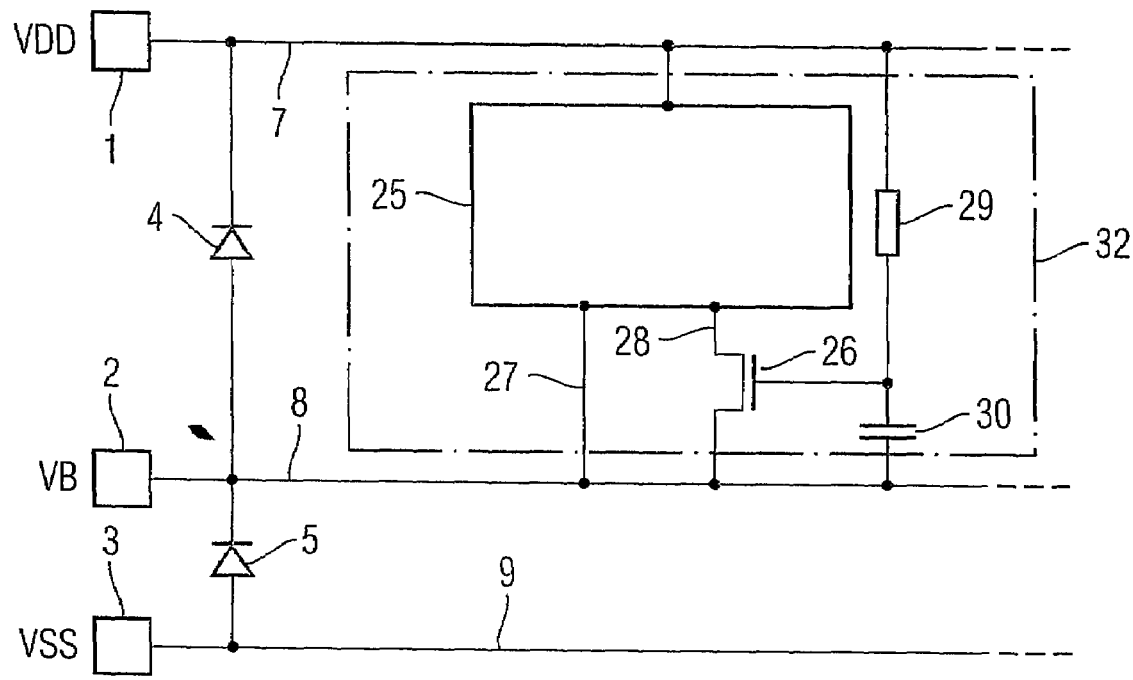
FIG. 5 shows a fourth embodiment of the present invention.

FIG. 5 illustrates a fourth embodiment of the present invention. By contrast with FIG. 4, the gate of the MOS transistor 26 is not connected to a fixed potential, but is triggered via a filter circuit, formed from a resistor 29 and a capacitance 30, the time constant of which is chosen in such a way that when an electrostatic discharge occurs on the virtual supply voltage line 8 a potential is applied to the gate of the MOS transistor 26, which switches it into a high ohmic state, while the MOS transistor 26 is in a low ohmic state in normal operation. Instead of the RC element consisting of resistor 29 and capacitance 30, other circuits which recognise the presence of an electrostatic discharge and trigger the MOS transistor 26 accordingly can also be used in other embodiments. In addition, instead of the MOS transistor 26, a different control element can also be used in embodiments.

Figure 6:
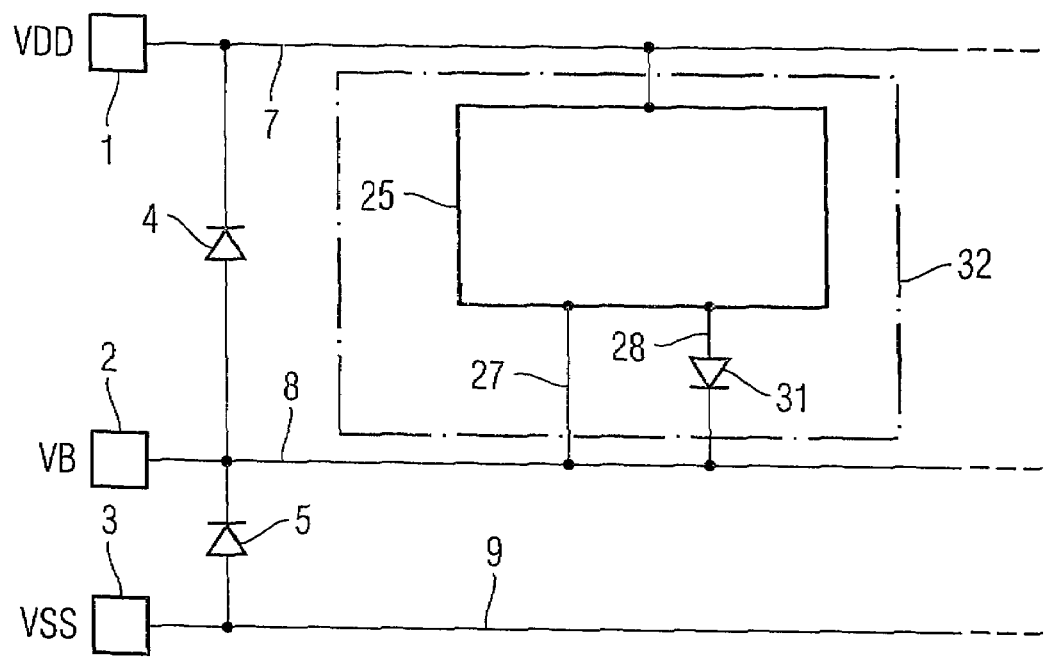
FIG. 6 shows a fifth embodiment of the present invention.

FIG. 6 illustrates a fifth embodiment of the present invention. Compared to the second embodiment from FIG. 3, resistor 11 has been replaced by a diode 31.

Figure 7:
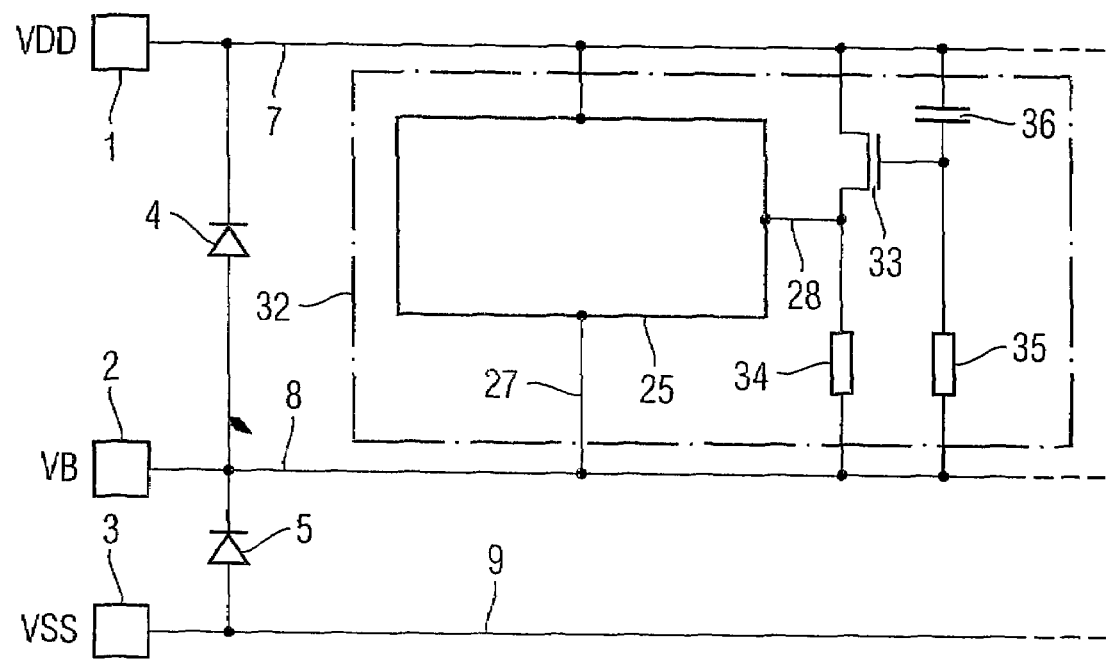
FIG. 7 shows a sixth embodiment of the present invention.

FIG. 7 illustrates a sixth embodiment of the present invention. Here terminal 28, i.e. the well terminals of transistors 12, is triggered via a filter circuit comprising an MOS transistor 33, resistors 34 and 35 and a capacitance 36. The time constant of the filter circuit is chosen in such a way that if there is an electrostatic discharge the filter circuit biases the p-wells of transistors 12, while there is no such bias in normal operation.

Typical time constants for the filter circuits of FIGS. 5 and 7 are in the range of nanoseconds to microseconds.

Figure 8:
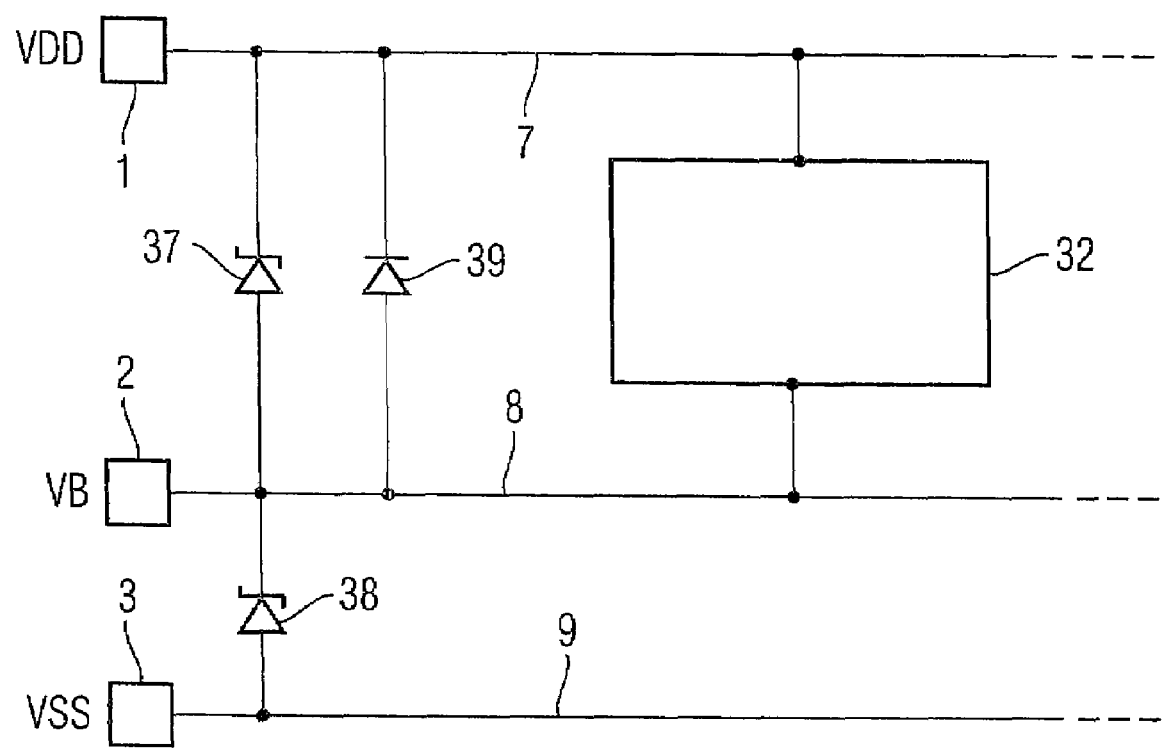
FIG. 8 shows a seventh embodiment of the present invention.

Finally, FIG. 8 illustrates a seventh embodiment of the present invention. This embodiment can be combined with all the protection circuits 32 of the preceding embodiments. In the seventh embodiment from FIG. 8, instead of protective elements 4 and 5, configured as diodes, other elements 37 and 38 are provided, for example elements such as zener diodes, which are operated in a breakdown regime. In this embodiment, additionally a diode 39, as illustrated, is coupled between the virtual supply voltage line 8 and the positive supply voltage line 7, supporting the shunting of positive discharges at terminal 2 to the positive supply voltage line 7, mentioned above. Elements 4, 5 and 38 in FIGS. 7 or 8 protect in the case of discharges at terminal 2.

It should be noted that further modifications and adaptations of the above embodiments are possible. The individual resistors 10 of the parallel current paths may, for instance, be formed not only by polysilicon resistors, but also by any other types of resistors. Furthermore, in embodiments not all resistors 10 have the same value. Instead of resistor 11 of the first and second embodiments, which produces a connection to the virtual supply voltage line 8 jointly for all the well terminals, in other embodiments separate resistors or other circuit elements as illustrated in the other embodiments may be provided for the individual well terminals. In addition, the embodiment may not only be used between a positive supply voltage and a virtual current supply line, as illustrated in the Figures, but also, for example, between two virtual current supply lines or other terminals. Finally, while in the embodiments the implementations with NFET transistors are illustrated, the reverse implementation with PFET transistors or an appropriate construction with other transistors is also possible in other embodiments.

Accordingly, while the invention disclosed herein has been described in terms of several preferred embodiments, there are numerous alterations, permutations, and equivalents which fall within the scope of the invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for protecting a circuit from electrostatic discharges, the circuit including a first terminal and a second terminal, the device comprising:
   at least one current path, wherein each current path of the at least one current path comprises a transistor and a first circuit element;
   wherein a first load terminal of the transistor is coupled to the first terminal of the circuit;
   wherein a second load terminal of the transistor is coupled to a control terminal of the transistor and to a first terminal of the first circuit element;
   wherein a second terminal of the first circuit element is coupled to the second terminal of the circuit such that the transistor and the first circuit element are coupled in series between the first terminal and the second terminal; and
   wherein a well terminal of the transistor is coupled to the second terminal of the circuit via a second circuit element.

2. The device according to claim 1, wherein the transistor is a N-field-effect transistor, and wherein the well terminal of transistor is coupled to a p-well of the transistor.

3. The device according to claim 1, wherein the first circuit element comprises a resistor.

4. The device according to claim 1 wherein the second load terminal of the transistor is coupled to the control terminal of the transistor such that the transistor is in a diode configuration.

5. The device according to claim 1, wherein the transistor has a layer which is located between a substrate and a well of the transistor, said layer being coupled to the first terminal.

6. The device according to claim 1, wherein the transistor is formed as a triple well construction.

7. The device according to claim 1, wherein the second circuit element comprises at least one element selected from the group consisting of a resistor, a diode and a transistor having a control terminal coupled with a fixed potential.

8. The device according to claim 1, wherein the second circuit element comprises a circuit configured to detect an electrostatic discharge, the second circuit element being configured such that the connection between the well terminal of the transistor and the second terminal is more highly ohmic in the event of an electrostatic discharge than in the absence of the electrostatic discharge.

9. The device according to claim 1, wherein the second circuit element is configured such that the well terminal of the transistor is actively biased during an electrostatic discharge.

10. The device according to claim 1, wherein the at least one current path comprises a plurality of parallel current paths, each of the plurality of parallel current paths comprising a transistor and a first circuit element coupled in series between the first terminal and the second terminal.

11. A circuit arrangement comprising:
    a first terminal;
    a second terminal;
    a protection device comprising at least one current path, wherein each current path of the at least one current path comprises a transistor and a first circuit element; and
    a circuit section coupled in parallel to said protection device;
    wherein a first load terminal of the transistor is coupled to the first terminal of the circuit arrangement;
    wherein a second load terminal of the transistor is coupled to a control terminal of the transistor and to a first terminal of the first circuit element;
    wherein a second terminal of the first circuit element is coupled to the second terminal of the circuit; and
    wherein a well terminal of the transistor is coupled to the second terminal of the circuit arrangement via a second circuit element.

12. The circuit arrangement according to claim 11, wherein the first terminal is a terminal for a supply voltage.

13. The circuit arrangement according to claim 11, wherein the second terminal is a terminal of a virtual supply voltage line.

14. The circuit arrangement according to claim 11, wherein the first terminal is configured to apply a voltage which is higher than a voltage at which circuit elements of said circuit section are configured.

15. The circuit arrangement according to claim 11, further comprising a protective element coupled between the first terminal and the second terminal.

16. The circuit arrangement according to claim 15, wherein the protective element comprises a diode.

17. The circuit arrangement according to claim 15, wherein the protective element comprises a zener diode and wherein a further diode is coupled between the first terminal and the second terminal in parallel to the zener diode.

18. The circuit arrangement according to claim 17, wherein the protective element comprises a protective element configured for operation in breakdown.

19. The circuit arrangement according to claim 11, further comprising a third terminal and a further protective element coupled between the second terminal and the third terminal.

20. The circuit arrangement according to claim 11, wherein the circuit arrangement is provided as an integrated circuit and wherein the transistor and the first circuit element are coupled in series between the first terminal and the second terminal.

21. A method for protecting a circuit from electrostatic discharges, the circuit including a first terminal and a second terminal, the method comprising:
    providing at least one current path, each current path of the at least one current path comprising a transistor and a first circuit element;
    coupling a first load terminal of the transistor to the first terminal of the circuit;
    coupling a second load terminal and a control terminal of the transistor to a first terminal of the first circuit element;
    coupling a second terminal of the first circuit element to the second terminal of the circuit such that the transistor and the first circuit element are coupled in series between the first terminal and the second terminal; and
    coupling a well terminal of the transistor to the second terminal of the circuit via a second circuit element.

* * * * *